United States Patent
Shirakawa et al.

[11] Patent Number: 5,629,128
[45] Date of Patent: May 13, 1997

[54] POSITIVE PHOTORESIST COMPOSITION

[75] Inventors: Koji Shirakawa; Kenichiro Sato; Kunihiko Kodama; Yasumasa Kawabe; Shinji Sakaguchi, all of Shizuoka, Japan

[73] Assignee: Fuji Photo Film Co., Ltd., Kanagawa, Japan

[21] Appl. No.: 531,081

[22] Filed: Sep. 20, 1995

[30] Foreign Application Priority Data

Oct. 31, 1994 [JP] Japan .................................. 6-267491

[51] Int. Cl.$^6$ ............................................. G03F 7/023
[52] U.S. Cl. ........................... 430/192; 430/191; 430/193; 534/557
[58] Field of Search ............................ 430/165, 192, 430/193, 191; 534/557

[56] References Cited

U.S. PATENT DOCUMENTS

| | | | |
|---|---|---|---|
| 5,283,155 | 2/1994 | Uetani et al. | 430/192 |
| 5,401,605 | 3/1995 | Doi et al. | 430/192 |
| 5,407,779 | 4/1995 | Uetani et al. | 430/192 |
| 5,407,780 | 4/1995 | Hioki et al. | 430/192 |
| 5,429,905 | 7/1995 | Tan et al. | 430/192 |
| 5,434,031 | 7/1995 | Nakao et al. | 430/193 |

*Primary Examiner*—John S. Chu
*Attorney, Agent, or Firm*—Sughrue, Mion, Zinn, Macpeak & Seas

[57] ABSTRACT

A positive photoresist composition is described, which comprises an alkali-soluble resin and 1,2-naphthoquinonediazido-5-(and/or -4-)sulfonate of a polyhydroxy compound represented by the following formula (I):

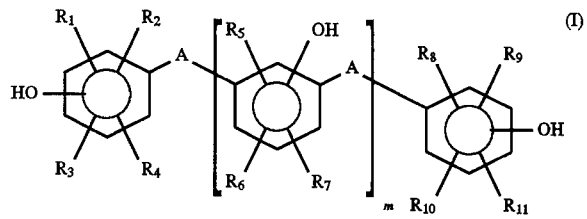

wherein $R_1$ to $R_{11}$ are the same or different and each represents a hydrogen atom, a halogen atom, an alkyl group, an aryl group, an alkoxyl group, an acyl group or a cycloalkyl group, provided that at least one of $R_1$ to $R_{11}$ is a cycloalkyl group; A represents $-CH(R_{12})-$, in which $R_{12}$ represents a hydrogen atom or an alkyl group; and m represents 2 or 3.

10 Claims, No Drawings

POSITIVE PHOTORESIST COMPOSITION

FIELD OF THE INVENTION

The present invention relates to a positive photoresist composition which comprises an alkali-soluble resin and a specific 1,2-quinonediazide compound and is sensitive to radiation such as ultraviolet ray, far ultraviolet ray, X-ray, electron beam, molecular beam, gamma-ray, and synchrotron radiation. More particularly, the present invention relates to a positive photoresist composition for forming fine patterns having a high resolving power irrespective of the variation of the layer thickness which is less in generation of development residue, excellent in a development latitude, and excellent in storage stability with the lapse of time.

BACKGROUND OF THE INVENTION

The positive photoresist composition of the present invention is coated on a substrate such as a semiconductor wafer, glass, ceramic or metal in a thickness of from 0.5 to 2 µm by a spin coating method or a roller coating method. Subsequently, the coated layer is heated and dried, and a circuit pattern or other pattern is printed on the layer by, for example, irradiation with ultraviolet ray through an exposure mask, and then the exposed photoresist layer is subjected to baking after exposure, if necessary, and is developed to form a positive image.

Further, the substrate can be etched using the positive image as a mask to form the pattern on the substrate. Typical applications of the positive photoresist are manufacture of semiconductors such as IC and the like, manufacture of circuit boards for liquid crystals and thermal heads, and other photofabrication processes.

Positive photoresist compositions generally comprise an alkali-soluble resin binder such as a novolak resin and the like and a naphthoquinonediazide compound as a photosensitive material.

Novolak resins used as a binder are soluble in an aqueous alkaline solution without swelling therein and are highly resistant particularly to plasma etching when the image formed is used as a mask for etching. They are, therefore, particularly useful in this application. On the other hand, naphthoquinonediazide compounds used as a photosensitive material act themselves as a dissolution inhibitor to lower the alkali solubility of the novolak resin, but are peculiar in that when decomposed by light irradiation to produce an alkali-soluble substance which elevates the alkali solubility of the novolak resin. Because of the great light dependent variation of the properties, naphthoquinonediazide compounds are particularly useful as a photosensitive material in a positive photoresist composition.

Hitherto, various positive photoresists comprising a novolak resin and a naphthoquinonediazide photosensitive material have been developed and put into practical use from such a point. In particular, the progress of the resist materials is conspicuous in high resolving power and the materials have attained sufficient results in forming a line width of as small as sub-micrometers.

Conventionally, it has been thought that resists having a high contrast (gamma value (γ)) are advantageously used to elevate the resolving power to obtain image reproduction of a good pattern form. Therefore, researches have been made to develop a resist composition serving such a purpose. Many publications disclosing such a technique have been published. In particular, with respect to the novolak resin as a main component of positive photoresists, many patent applications have been filed based on the monomer component, distribution of molecular weight, the synthesis method and the like, and some results have been obtained. On the other hand, with respect to another main component photosensitive material, compounds having various structures which are seemed to be advantageous to realize a high contrast have been disclosed. By designing a positive photoresist using these techniques, it has become possible to develop a resist having an ultrahigh resolving power capable of resolving the pattern of the same degree of the dimension as the wavelength of light.

However, integrated circuits have added to the degree of integration increasingly, and the formation of ultrafine patterns of a line width of 0.5 µm or less has been required in the production of a semiconductor substrate such as super LSI. In such an application, photoresists having a broad development latitude are required, in particular, to obtain a stable high resolution and secure the formation of a constant line width. Further, it is required that resist residues are not generated on the pattern of the resist after development to prevent processing defects of the circuit.

Moreover, it has been found that in the formation of, in particular, ultrafine patterns of a line width of 0.5 µm or less, for example, even if a certain level of resolving power can be obtained at a certain coating layer thickness, the resolving power deteriorates with an extremely trace variation of the coating layer thickness (hereinafter, referred to as "layer thickness reliance"). A resolving power is largely changed with the variation of the layer thickness of only several hundredths of a micrometer, and it has been found that almost all the representative positive photoresists now commercially available have more or less such a tendency. Specifically, when the layer thickness of the resist before exposure changes in the range of λ/4n based on the prescribed layer thickness (where λ is an exposure wavelength and n is a refractive index of the resist layer at that wavelength), the resolving power to be obtained fluctuates correspondingly.

The presence of this layer thickness reliance is disclosed, for example, in *SPIE Proceedings*, Vol. 1925, page 626 (1993) such that this phenomenon is caused by the multiple reflection effect of light in a resist layer.

It has been found that, in particular, when the contrast of a resist is to be heightened to obtain a high resolving power and a resist pattern having a rectangle cross-section, this layer thickness reliance often becomes large. When a semiconductor substrate is practically processed, a resist pattern is formed using a resist layer of a delicately different coated layer thicknesses according to surface roughness of the substrate or coating unevenness. Accordingly, this layer thickness reliance has been an obstacle when an ultrafine pattern near to the limitation of the resolving power using a positive photoresist is processed.

Hitherto, various 1,2-naphthoquinonediazide compounds of polyhydroxy compounds having a specific structure have been proposed to heighten a resolving power, for example, those disclosed in JP-A-57-63526 (the term "JP-A" as used herein means an "unexamined published Japanese patent application"), JP-A-60-163043, JP-A-62-10645, JP-A-62-10646, JP-A-62-150245, JP-A-63-220139, JP-A-64-76047, JP-A-1-189644, JP-A-2-285351, JP-A-2-296248, JP-A-2-296249, JP-A-3-48249, JP-A-3-48250, JP-A-3-158856, JP-A-3-228057, JP-A-4-502519, U.S. Pat. No. 4,957,846, 4,992,356, 5,151,340, 5,178,986, and European Patent 530148. However, these photosensitive materials have not been sufficient to lower the layer thickness reliance.

1,2-Naphthoquinonediazidosulfonates of the compound represented by the following formula (II) are disclosed, for example, in JP-A-2-296248, as the photosensitive material having four aromatic rings in the molecule, but these photosensitive materials are not sufficient for lowering the layer thickness reliance.

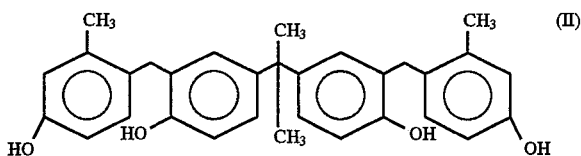

Further, 1,2-naphthoquinonediazidosulfonates of the compounds represented by the following formula (III) and formula (IV) are disclosed, for example, in JP-A-3-291250 and JP-A-6-19130, respectively, as the photosensitive material having a cycloalkyl group in the molecule, but these photosensitive materials are not sufficient for lowering the layer thickness reliance.

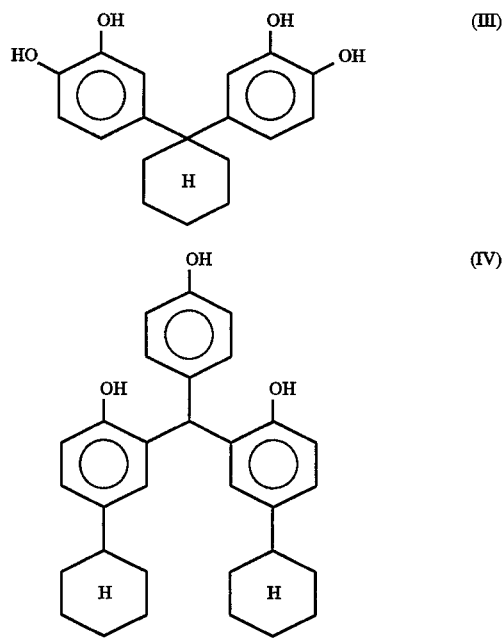

On the other hand, resists having a high contrast and a high resolving power can be obtained by using a photosensitive material having a hydroxyl group in the molecule as disclosed, for example, in JP-B-37-18015 (the term "JP-B" as used herein means an "examined Japanese patent publication"), JP-A-58-150948, JP-A-2-19846, JP-A-2-103543, JP-A-3-228057, JP-A-5-323597, JP-A-6-148878, JP-A-6-167805, JP-A-6-202321, U.S. Pat. Nos. 3,061,430, 3,130,047, 3,130,048, 3,130,049, 3,102,809, 3,184,310, 3,188,210, 3,180,733, West German Patent 938,233, *SPIE Proceeding*, Vol. 631, page 210, *ibid.*, Vol. 1672, page 231 (1992), *ibid.*, Vol. 1672, page 262 (1992), and *ibid.*, Vol. 1925, page 227 (1993).

The present inventors have proposed compounds represented by the following formulae (V) and (VI) as selectively esterified photosensitive materials having four or five aromatic rings in the molecule (JP-A-3-228057).

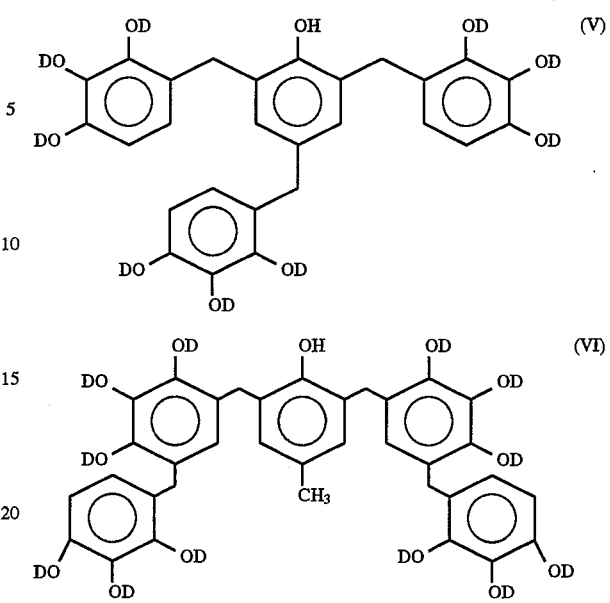

However, these compounds are not- sufficient for lowering the layer thickness reliance, either.

Thus, it has not been known absolutely how to design the resist composition to lower the layer thickness reliance and obtain a high resolving power irrespective of the variation of the layer thickness.

Further, according to the increase of the degree of integration in semiconductor devices, demands for particles of the positive photoresist have increased year after year. As there is a so-called ¹⁄₁₀ rule in the art of the semiconductor, a particle size of ¹⁄₁₀ or more of the minimum line width of a device affects the yield (e.g., *Ultraclean Technology*, Vol. 3, No. 1, page 79 (1991)).

Various contrivances have been usefully adopted to reduce these particles such that an ultrafine filter having a pore diameter of 0.1 μm or 0.05 μm is used at the time of producing a resist.

However, even if there are less such particles in the resist at the time of resist production, they often increase with the lapse of time almost because of 1,2-quinonediazide photosensitive material and various means have been taken to improve the property with the lapse of time.

Various methods have been tried hitherto, for example, the method of using such a photosensitizer as a part of the hydroxyl group in the polyhydroxy compound is acylated or sulfonylated (JP-A-62-178562), the method of using a mixture of 1,2-naphthoquinonediazido-4-sulfonate and 1,2-naphthoquinone-diazido-5-sulfonate (JP-A-62-284354), the method of using a thermal modified 1,2-naphthoquinonediazide photosensitizer (JP-A-63-113451), the method of reducing the remaining catalyst of a photosensitizer (JP-A-63-236030), the method of synthesizing a photosensitizer in the presence of an anion exchange resin (JP-A-63-236031), and the method of mixing a solvent having good solubility with a photosensitizer (JP-A-61-260239 and JP-A-1-293340).

SUMMARY OF THE INVENTION

One object of the present invention is to provide a positive photoresist composition for ultrafine processing which has a high resolving power and is less in the layer thickness reliance of the resolving power. The term "layer thickness reliance" used in the present invention means the fluctuation of the resolving power of the resist obtained by exposure (subjecting to baking, if necessary) and development when the layer thickness of the resist before exposure changes in the range of λ/4n based on the prescribed layer thickness.

Another object of the present invention is to provide a positive photoresist composition which has a broad development latitude and is less in generation of development residue. Herein, the development latitude can be represented by the development time reliance of the line width of the resist obtained by development or the temperature reliance of the developing solution. Further, the development residue means a trace amount of insoluble matter of the resist remained between ultrafine patterns after development which can be measured by a scanning electron microscope or the like.

A further object of the present invention is to provide a positive photoresist composition extremely excellent in the storage stability in which a photosensitizer does not precipitate with the lapse of time, microgel does not generate, that is, there is no increase of particles.

The present inventors have extensively investigated various positive photoresist compositions in considering the above described problems of the prior art compositions and, as a result, have found that the objects of the present invention can be attained by a positive photoresist composition comprising an alkali-soluble resin and a 1,2-quinonediazide compound having a particular structure. Thus, the present invention has been accomplished.

Accordingly, these and other objects of the present invention have been attained by a positive photoresist composition comprising an alkali-soluble resin and 1,2-naphthoquinonediazido-5-(and/or -4-)sulfonate (1,2-naphthoquinonediazido-5-(and/or -4-)sulfonic acid ester) of a polyhydroxy compound represented by the following formula (I):

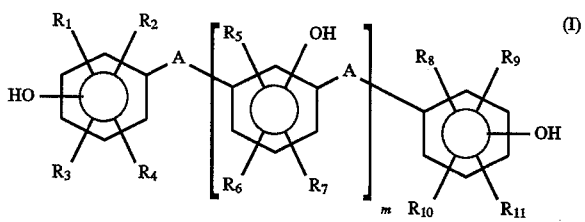

wherein $R_1$, $R_2$, $R_3$, $R_4$, $R_5$, $R_6$, $R_7$, $R_8$, $R_9$, $R_{10}$ and $R_{11}$ ($R_1$ to $R_{11}$) are the same or different and each represents a hydrogen atom, a halogen atom, an alkyl group, an aryl group, an alkoxyl group, an acyl group or a cycloalkyl group, provided that at least one of $R_1$ to $R_{11}$ is a cycloalkyl group; A represents

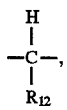

in which $R_{12}$ represents a hydrogen atom or an alkyl group; and m represents 2 or 3.

DETAILED DESCRIPTION OF THE INVENTION

The present invention is explained in detail below.

It is not clearly known why a positive photoresist composition having an extraordinary high resolving power, excellent in the layer thickness reliance, having a broad development latitude, hardly liable to generate development residue, and extremely excellent in storage stability can be obtained by using the photosensitive material of the present invention, but it is presumably because the photosensitive material of the present invention is a compound having structural characteristics such that 1) it is straight chain, 2) it has four or five aromatic rings, 3) the aromatic rings each has a hydroxyl group, and 4) a cycloalkyl group is present in the molecule. Further, of the above structural characteristics, the presence of a cycloalkyl group seems to contribute to the improvement of the storage stability. That is, it has been found that the above characteristics 1) to 3) are especially effective for improving a resolving power and the layer thickness reliance and the above characteristics 4) is especially effective for improving storage stability. These results are unexpected from the conventional knowledge.

In formula (I) above, the alkyl group represented by $R_1$ to $R_{12}$ is preferably an alkyl group having from 1 to 4 carbon atoms such as a methyl group, an ethyl group, a propyl group, an isopropyl group, an n-butyl group, an isobutyl group, a sec-butyl group and a tert-butyl group, and particularly preferably a methyl group. The halogen atom represented by $R_1$ to $R_{11}$ is preferably a chlorine atom, a bromine atom or an iodine atom. The aryl group represented by $R_1$ to $R_{11}$ is preferably a phenyl group, a toluyl group, a xylyl group, a mesityl group or a cumenyl group. The alkoxy group represented by $R_1$ to $R_{11}$ is preferably a methoxy group, an ethoxy group, a propoxy group, an isopropoxy group, an n-butoxy group, an isobutoxy group, a sec-butoxy group or a tert-butoxy group. The acyl group represented by $R_1$ to $R_{11}$ is preferably a formyl group, an acetyl group or a benzoyl group. The cycloalkyl group represented by $R_1$ to $R_{11}$ is preferably a cyclopentyl group or a cyclohexyl group, and particularly preferably a cyclohexyl group.

Further, in the above formula (I), $R_1$ to $R_4$ and $R_8$ to $R_{11}$ are specifically preferably a methyl group, an ethyl group, a chlorine atom, a methoxy group, an acetyl group or a phenyl group; and $R_5$ to $R_7$ are preferably a methyl group, an ethyl group, an isopropyl group, a phenyl group or a methoxy group.

The following compounds (I-1) to (I-12) can be cited as specific examples of the polyhydroxy compounds represented by formula (I), but the compounds which can be used in the present invention should not be construed as being limited thereto. These polyhydroxy compounds can be used alone or in admixture of two or more.

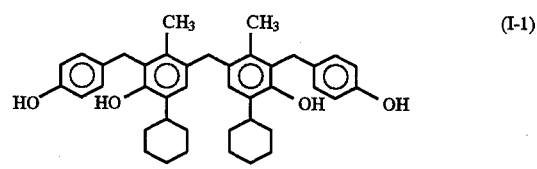

(I-1)

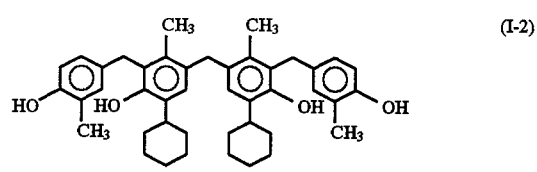

(I-2)

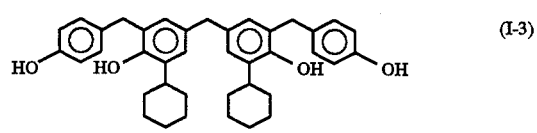

(I-3)

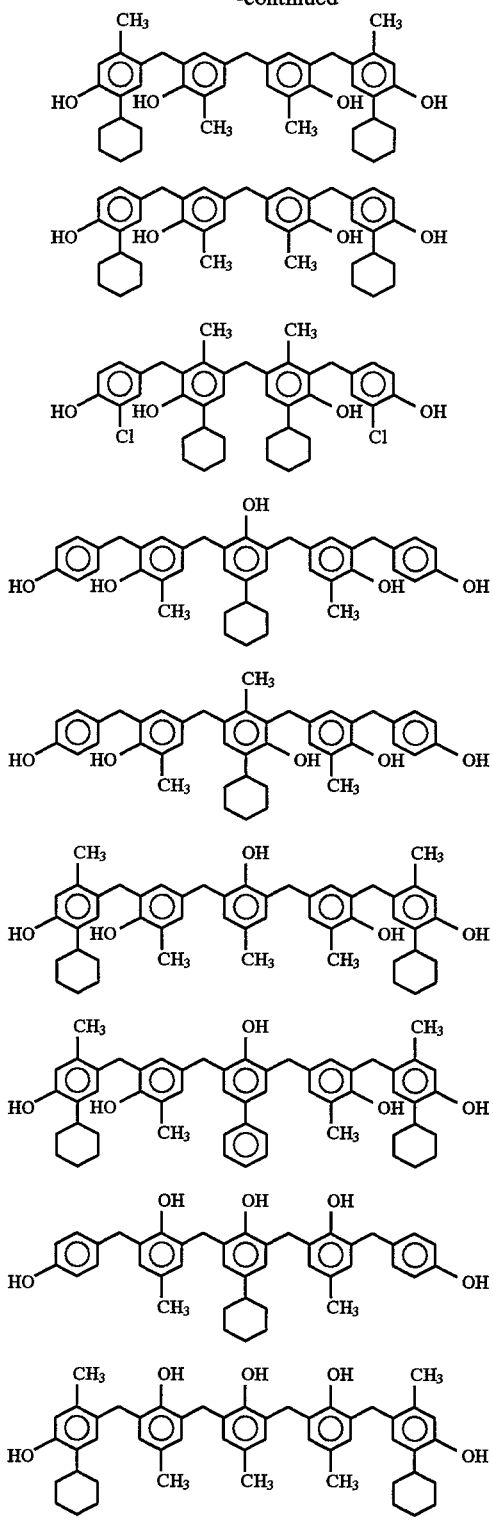

The photosensitive material of the present invention can be obtained by the esterification reaction of, for example, the above described polyhydroxy compound and 1,2-naphthoquinonediazido-5-(and/or -4-)sulfonyl chloride in the presence of a basic catalyst.

That is, a predetermined amount of a polyhydroxy compound, a predetermined amount of 1,2-naphthoquinonediazido-5-(and/or -4-)sulfonyl chloride and a predetermined amount of at least one solvent such as methyl isobutyl ketone, diglyme, ethyl acetate, acetonitrile, dichloroethane, dioxane, acetone, tetrahydrofuran, methyl ethyl ketone, N-methylpyrrolidone, chloroform, trichloroethane, trichloroethylene, dichloroethane or γ-butyrolactone are placed in a flask, and are condensed with dropwise adding thereto a basic catalyst such as sodium hydroxide, sodium carbonate, sodium hydrogencarbonate, triethylamine, 4-dimethylaminopyridine, 4-methylmorpholine, N-methylpiperazine, or N-methylpiperidine. The thus-obtained product is crystallized in water, then washed with water, purified and dried.

In an ordinary esterification reaction, mixtures of variously different esterification numbers and positions are obtained, but only specific isomers can also be selectively synthesized by selecting reaction conditions or the structures of polyhydroxy compounds. The esterification rate in the present invention is defined as the average value of these mixtures.

The esterification rate thus defined can be controlled by the mixing ratio of raw materials, 1,2-naphthoquinonediazido-5-(and/or -4-)sulfonyl chlorides and polyhydroxy compounds. That is, as substantially all 1,2-naphthoquinone-diazido-5-(and/or -4-)sulfonyl chlorides added are subjected to esterification reaction, the mixture of the desired esterification rate can be obtained by adjusting the charging mol ratio of raw materials.

The mol ratio of the 1,2-naphthoquinonediazido-5-(and/or -4-)sulfonyl chloride to the above polyhydroxy compound (1,2-naphthoquinonediazide/polyhydroxy compound) is preferably from 1.2 to 3.2 when m is 2 in the above formula (I), and from 1.2 to 3.8 when m is 3, and more preferably from 1.5 to 2.8 when m is 2, and from 1.8 to 3.5 when m is 3. When the mol ratio is in the above range, a definite amount of the polyhydroxy compound remains in the reactant and it is effective for the objects of the present invention. When the charging mol ratio is smaller than the above range, the layer thickness in the unexposed area extremely decreases and, on the contrary, when it is larger than the above range, the effects of the present invention cannot be obtained, as the storage stability deteriorates or the like.

1,2-Naphthoquinonediazido-5-sulfonate and 1,2-naphthoquinonediazido-4-sulfonate can be used in combination in the present invention, if necessary. The reaction temperature in the above described method is usually from $-20°$ to $60°$ C. and preferably from $0°$ to $40°$ C.

The photosensitive material synthesized in the method as above is used as a resin composition alone or in combination of two or more in admixture with an alkali-soluble resin, and the amount of the photosensitive material to the novolak resin is from 5 to 150 parts by weight, preferably from 20 to 100 parts by weight, based on 100 parts by weight of the novolak resin. If the amount is less than 5 parts by weight, the residual layer ratio decreases markedly, whereas if the amount exceeds 150 parts by weight, the sensitivity and the solubility in a solvent decrease.

The alkali-soluble resins for use in the present invention include novolak resins, acetone-pyrogallol resins, and polyhydroxystyrenes and derivatives thereof.

Novolak resins are particularly preferred of them, and can be obtained by addition condensation of the specific monomer as a main component with an aldehyde in the presence of an acidic catalyst.

Examples of the specific monomers include phenol; cresols such as m-cresol, p-cresol, and o-cresol; xylenols such as 2,5-xylenol, 3,5-xylenol, 3,4-xylenol, and 2,3-xylenol; alkylphenols such as m-ethylphenol, p-ethylphenol, o-ethylphenol, and p-t-butylphenol; trialkylphenols such as 2,3,5-trimethylphenol and 2,3,4-trimethylphenol; alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, and p-butoxyphenol; bisalkylphenols such as 2-methyl-4-isopropylphenol; and hydroxy aromatic compounds such as m-chlorophenol, p-chlorophenol, o-chlorophenol, dihydroxy-biphenyl, bisphenol A, phenylphenol, resorcinol, and naphthol. These compounds can be used alone or in combinations of two or more, but the monomers are not limited to the above compounds.

Examples of the aldehydes for use in the present invention include formaldehyde, paraformaldehyde, acetaldehyde, propyl aldehyde, benzaldehyde, phenylacetaldehyde, α-phenylpropyl aldehyde, β-phenylpropyl aldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and acetals thereof, e.g., chloroacetaldehyde diethylacetal. Of these aldehydes, formaldehyde is preferably used.

These aldehydes may be used alone or in combination of two or more.

The useful acidic catalysts include hydrochloric acid, sulfuric acid, formic acid, acetic acid, and oxalic acid.

Further, novolak resins from which low molecular components are removed or decreased are preferably used as disclosed in JP-A-60-45238, JP-A-60-97347, JP-A-60-140235, JP-A-60-189739, JP-A-64-14229, JP-A-1-276131, JP-A-2-60915, JP-A-2-275955, JP-A-2-282745, JP-A-4-101147, and JP-A-4-122938.

The weight average molecular weight of the novolak resin thus obtained is preferably from 2,000 to 20,000. If the molecular weight is less than 2,000, the layer thickness in the unexposed area after development greatly decreases, whereas if it exceeds 20,000, the developing speed is reduced. A particularly preferred range of the weight average molecular weight is from 3,000 to 15,000. The terminology "weight average molecular weight" used herein is defined as a polystyrene calculated value in gel permeation chromatography.

In addition, the degree of dispersion of the novolak resin (the ratio of the weight average molecular weight to the number average molecular weight, that is Mw/Mn) is preferably from 1.5 to 7.0, more preferably from 1.5 to 4.0. If this value exceeds 7, the effect of the present invention of excellent layer thickness reliance cannot be obtained, on the contrary, if it is less than 1.5, a highly accurate purification process necessary for the synthesis of novolak resins is impracticable.

The composition of the present invention primarily contains the above described photosensitive material but, if necessary, may additionally use in combination the esterified products of the following shown polyhydroxy compounds and 1,2-naphthoquinonediazido-5-(and/or -4-)sulfonyl chloride.

In such a case, the proportion of the naphthoquinonediazide esterified photosensitive materials of these polyhydroxy compounds to the photosensitive material of the present invention is preferably from 20/80 to 80/20 (weight ratio). That is, if the content of the photosensitive material of the present invention is less than 20 wt % in the entire photosensitive material, the effect of the present invention cannot be exhibited sufficiently.

Examples of polyhydroxy compounds for use in the present invention include polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, and 2,3,4,3',4',5'-hexahydroxybenzophenone;

polyhydroxyphenylalkylketones such as 2,3,4-trihydroxyacetophenone, 2,3,4-trihydroxyphenylpentylketone, and 2,3,4-trihydroxyphenylhexylketone;

bis[(poly)hydroxyphenyl]alkanes such as bis(2,4-dihydroxyphenyl)methane, bis(2,3,4 -trihydroxyphenyl) methane, bis(2,4-dihydroxyphenyl)propane-1, bis(2,3,4-trihydroxyphenyl)-propane-1, and nordihydroguaiaretic acid;

polyhydroxybenzoates such as propyl 3,4,5-trihydroxybenzoate, phenyl 2,3,4-trihydroxybenzoate, and phenyl 3,4,5-trihydroxybenzoate;

bis(polyhydroxybenzoyl)alkanes or bis (polyhydroxybenzoyl)aryls such as bis(2,3,4-trihydroxybenzoyl)methane, bis(3-acetyl-4,5,6-trihydroxyphenyl)methane, bis(2,3,4-trihydroxybenzoyl) benzene, and bis(2,4,6-trihydroxybenzoyl)benzene;

alkylene-di(polyhydroxybenzoate)'s such as ethylene glycol-di(3,5-dihydroxybenzoate) and ethylene glycol-di(3,4,5-trihydroxybenzoate);

polyhydroxybiphenyls such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol, and 2,3,4,2',3',4'-biphenylhexol;

bis(polyhydroxy)sulfides such as 4,4'-thiobis(1,3-dihydroxy)benzene;

bis(polyhydroxyphenyl) ethers such as 2,2',4,4'-tetrahydroxydiphenyl ether;

bis(polyhydroxyphenyl) sulfoxides such as 2,2',4,4'-tetrahydroxydiphenyl sulfoxide;

bis(polyhydroxyphenyl) sulfones such as 2,2',4,4'-diphenyl sulfone;

polyhydroxytriphenylmethanes such as tris(4-hydroxyphenyl)methane, 4,4',4"-trihydroxy-3,5,3',5'-tetramethyltriphenylmethane, 4,4',3",4"-tetrahydroxy-3,5,3',5'-tetramethyltriphenylmethane, 4,4',2",3",4"-pentahydroxy-3,5,3',5'-tetramethyltriphenylmethane, 2,3,4,2',3',4'-hexahydroxy-5,5'-diacetyltriphenylmethane, 2,3,4,2',3',4',3",4"-octahydroxy-5,5'-diacetyltriphenylmethane, and 2,4,6,,2',4',6'-hexahydroxy-5,5'-dipropionyltriphenylmethane;

polyhydroxyspirobi-indanes such as 3,3,3',3'-tetramethyl-1,1'-spirobi-indane-5,6,5',6'-tetrol, 3,3,3',3'-tetramethyl-1,1'-spirobi-indane-5,6,7,5',6',7'-hexol, 3,3,3',3'-tetramethyl-1,1'-spirobi-indane-4,5,6,4',5',6'-hexol, and 3,3,3',3'-tetramethyl-1,1'-spirobi-indane-4,5,6,5',6',7'-hexol;

polyhydroxyphthalides such as 3,3-bis(3,4-dihydroxyphenyl)phthalide, 3,3-bis(2,3,4- trihydroxyphenyl)phthalide, and 3',4',5',6'-tetrahydroxyspiro[phthalide-3,9'-xanthene];

flavonoid dyes such as morin, quercetin and rutin;

the polyhydroxy compounds disclosed in JP-A-4-253058 such as α,α',α"-tris(4-hydroxyphenyl)-1,3,5-triisopropylbenzene, α,α',α"-tris(3,5-dimethyl-4-hydroxyphenyl)-1,3,5-triisopropylbenzene, α,α',α"-tris(3,5-diethyl-4-hydroxyphenyl)-1,3,5-triisopropylbenzene, α,α',α"-tris(3,5-di-n-propyl-4-hydroxyphenyl)-1,3,5-triisopropylbenzene, α,α',α"-tris(3,5-diisopropyl-4-hydroxyphenyl)-1,3,5-triisopropylbenzene, α,α',α"-tris(3,5-di-n-butyl-4-hydroxyphenyl)-1,3,5-triisopropylbenzene, α,α',α"-tris(3-methyl-4-hydroxyphenyl)-1,3,5-triisopropylbenzene, α,α',α"-tris(3-methoxy-4-hydroxyphenyl)-1,3,5-triisopropylbenzene,α,α',α"-tris(2,4-dihydroxy-phenyl)- 1,3,5-triisopropylbenzene, 1,3,5-tris(3,5-dimethyl-4-hydroxyphenyl)benzene, 1,3,5-tris(5-methyl-2-hydroxyphenyl)benzene, 2,4,6-tris(3,5-dimethyl-4-hydroxyphenylthiomethyl)mesitylene, 1-[α-methyl-α-(4'-hydroxyphenyl)ethyl]-4-[α,α'-bis(4"-hydroxyphenyl)ethyl]benzene, 1-[α-methyl-α-(4'-hydroxyphenyl)ethyl]-3-[α,α'-bis(4"-hydroxyphenyl)ethyl]benzene, 1-[α-methyl-α-(3',5'-dimethyl-4'-hydroxyphenyl)ethyl]-4-[α,α'-bis(3",5"-dimethyl-4"-hydroxyphenyl)ethyl]benzene, 1-[α-methyl-α-(3'-methyl-4'-hydroxyphenyl)ethyl]-4-[α',α'-bis(3"-methyl-4"-hydroxyphenyl)ethyl]benzene, 1-[α-methyl-α-(3'-methoxy-4'-hydroxyphenyl)ethyl]-4-[α',α'-bis(3"-methoxy-4"-hydroxyphenyl)ethyl]benzene, 1-[α-methyl-α-(2',4'-dihydroxyphenyl)ethyl]-4-[α',α'-bis(4"-hydroxyphenyl)ethyl]benzene, and 1-[α-methyl-α-(2',4'-dihydroxyphenyl)ethyl]-3-[α",α'-bis(4"-hydroxyphenyl)ethyl]benzene;

p-bis(2,3,4-trihydroxybenzoyl)benzene, p-bis(2,4,6-trihydroxybenzoyl)benzene, m-bis(2,3,4-trihydroxybenzoyl)benzene, m-bis(2,4,6-trihydroxybenzoyl)benzene, p-bis(2,5-dihydroxy-3-bromobenzoyl)benzene, p-bis(2,3,4-trihydroxy-5-methylbenzoyl)benzene, p-bis(2,3,4-trihydroxy-5-methoxybenzoyl)benzene, p-bis(2,3,4-trihydroxy-5-nitrobenzoyl)benzene, p-bis(2,3,4-trihydroxy-5-cyanobenzoyl)benzene,1,3,5-tris(2,5-dihydroxybenzoyl)benzene,1,3,5-tris(2,3,4-trihydroxybenzoyl)benzene, 1,2,3-tris(2,3,4-trihydroxybenzoyl)benzene, 1,2,4-tris(2,3,4-trihydroxybenzoyl)benzene, 1,2,4,5-tetrakis(2,3,4-trihydroxybenzoyl)benzene, α,α'-bis(2,3,4-trihydroxybenzoyl)-p-xylene, and α,α',α'-tris(2,3,4-trihydroxybenzoyl)mesitylene; and 2,6-bis(2'-hydroxy-3',5'-dimethylbenzyl)-p-cresol, 2,6-bis(2'-hydroxy-5'-methylbenzyl)-p-cresol, 2,6-bis(2'-hydroxy-3',5'-di-t-butylbenzyl)-p-cresol, 2,6-bis(2'-hydroxy-5'-ethylbenzyl)-p-cresol, 2,6-bis(2',4'-dihydroxybenzyl)-p-cresol, 2,6-bis(2'-hydroxy-3'-t-butyl-5'-methylbenzyl)-p-cresol, 2,6-bis(2',3',4'-trihydroxy-5'-acetylbenzyl)-p-cresol, 2,6-bis(2',4',6'-trihydroxybenzyl)-p-cresol, 2,6-bis(2',3',4'-trihydroxybenzyl)-p-cresol, 2,6-bis(2',3',4'-trihydroxybenzyl)-3,5-dimethylphenol, 4,6-bis(4'-hydroxy-3',5'-dimethylbenzyl)pyrogallol, 4,6-bis(4'-hydroxy-3',5'-dimethoxybenzyl)pyrogallol, 2,6-bis(4'-hydroxy-3',5'-dimethylbenzyl)-1,3,4-trihydroxyphenol, 4,6-bis(2',4',6'-trihydroxybenzyl)-2,4-dimethylphenol, and 4,6-bis(2',3',4'-trihydroxybenzyl)-2,5-dimethylphenol.

Further, a low nucleus phenolic resin such as a novolak resin can also be used.

Moreover, the composition of the present invention may contain a polyhydroxy compound in order to accelerate the solubility of the composition in a developing solution. Preferred examples of polyhydroxy compounds useful for this purpose include phenols, resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensation resins, phloroglucide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl)methane, 1,1-bis(4-hydroxyphenyl)cyclohexane, 4,4'-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane,2,2,5,5-tetrakis(4-hydroxyphenyl)hexane, 1,2-tetrakis(4-hydroxyphenyl)ethane, 1,1,3-tris(hydroxyphenyl)butane, and p-[α,α,α',α'-tetrakis(4-hydroxyphenyl)]xylene.

The amount of these polyhydroxy compounds to the alkali-soluble resin is usually 100 parts by weight or less, preferably 80 parts by weight or less, and more preferably 60 parts by weight or less, based on 100 parts by weight of the alkali-soluble resin.

Examples of solvents which dissolve the photosensitive materials and alkali-soluble resins of the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutyrate, methyl 3-methoxypropionate, ethyl 3-methoxypropionate, ethyl 3-ethoxypropionate, methyl 3-ethoxypropionate, methyl pyruvate, ethyl pyruvate, ethyl acetate, and butyl acetate. These organic solvents are used alone or in combination of two or more.

Further, high boiling point solvents such as N-methylformamide, N,N-dimethylformamide, N-methylacetamide, N,N-dimethylacetamide, N-methylpyrrolidone, dimethylsulfoxide, and benzyl ethyl ether can be used in admixture.

The positive photoresist composition of the present invention can contain a surfactant for further improving the coating property such as striation.

Examples of surfactants include nonionic surfactants such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), polyoxyethylenepolyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); fluorine surfactants such as Eftop EF301, EF303, EF352 (Shin-Akita Chemical Co., Ltd.), Megafac F171, F173 (Dainippon Ink & Chemicals, Inc.), Florad FC430, FC431 (Sumitomo 3M Limited), and Asahiguard AG710, Surfron S-382, SC101, SC102, SC103, SC104, SC105, SC106 (Asahi Glass Co., Ltd.); and organosiloxane polymer KP341 (Shin-Etsu Chemical Co., Ltd.), acrylic acid or methacrylic acid (co) polymers Polyflow No. 75, No. 95 (Kyoei-Sha Oils and Fats Chemical Industries Co., Ltd.). Of these surfactants, fluorine surfactants and silicon surfactants are particularly preferred. The surfactants are used in an amount of usually 2 parts by weight or less, preferably one part by weight or less, based on 100 parts by weight of the alkali-soluble resin and quinonediazide compound in the resist composition of the present invention.

These surfactants may be used alone or in combination of two or more thereof.

The developing solution for the positive photoresist composition of the present invention include alkaline aqueous solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethyl ethanolamine and triethanolamine; quaternary ammonium salts such as tetramethylammonium hydroxide, tetraethylammonium hydroxide and choline; and cyclic amines such as pyrrole and piperidine. The above alkaline aqueous solutions can further contain appropriate amounts of alcohols such as isopropyl alcohol and nonionic surfactants.

Preferred of these developing solutions is tertiary ammonium salt, and more preferred are tetramethylammonium hydroxide and choline.

The positive photoresist composition of the present invention may contain, if desired, a light absorbing agent, a crosslinking agent, or an adhesive aid. A light absorbing agent is added for preventing halation from a substrate or increasing visibility when coated on a transparent substrate, if needed. Specific examples of the light absorbing agents which can be preferably used in the present invention include those commercially available disclosed in *Techniques and Markets of Industrial Dyes* (CMC Publishing Co.) and *Dye Handbook* (compiled by the Association of Chemistry of Organic Synthesis), for example, C.I. Disperse Yellow 1, 3, 4, 5, 7, 8, 13, 23, 31, 49, 50, 51, 54, 56, 60, 64, 66, 68, 79, 82, 88, 90, 93, 102, 114 and 124, C.I. Disperse Orange 1, 5, 13, 25, 29, 30, 31, 44, 57, 72 and 73, C.I. Disperse Red 1, 5, 7, 13, 17, 19, 43, 50, 54, 58, 65, 72, 73, 88, 117, 137, 143, 199 and 210, C.I. Disperse Violet 43, C.I. Disperse Blue 96, C.I. Fluorescent Brightening Agent 112, 135 and 163, C.I. Solvent Yellow 14, 16, 33 and 56, C.I. Solvent Orange 2 and 45, C.I. Solvent Red 1, 3, 8, 23, 24, 25, 27 and 49, C.I. Pigment Green 10 and C.I. Pigment Brown 2. A light absorbing agent is generally used in an amount of 100 parts by weight or less, preferably 50 parts by weight or less, and more preferably 30 parts by weight or less, based on 100 parts by weight of the alkali-soluble resin.

A crosslinking agent is added in the range not affecting positive image formation for the purpose of adjusting sensitivity, improving heat resistance and improving dry etching resistance.

Examples of the crosslinking agents include the compounds obtained by reacting melamine, benzoguanamine, glycoluril or the like with formaldehyde or alkyl-modified products thereof, epoxy compounds, aldehydes, azide compounds, organic peroxides, and hexamethylenetetramines. These crosslinking agents can be used in an amount of less than 10 parts by weight, preferably less than 5 parts by weight, based on 100 parts by weight of the photosensitive material. If the amount of the crosslinking agent to the photosensitive material exceeds 10 parts by weight, sensitivity shows a drop and scum (resist residue) is liable to occur.

An adhesive aid is added primarily for improving adhesion of the substrate and the resist, in particular, for the purpose of preventing peeling off of the resist layer in the etching process. Specific examples of adhesive aids include chlorosilane such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis (trimethylsilyl)urea, dimethyltrimethylsilylamine, and γ-trimethylsilylimidazole; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazol, thiouracil, mercaptoimidazole, and mercaptopyrimidine; ureas such as 1,1-dimethylurea and 1,3-dimethylurea; and thiourea compounds.

These adhesive aids are usually used in an amount of less than 10 parts by weight, preferably less than 5 parts by weight, based on 100 parts by weight of the alkali-soluble resin.

The above described positive photoresist composition is coated by an appropriate coating means such as a spinner or a coater on a substrate commonly used in the production of precision integrated circuit elements (e.g., transparent substrate such as silicon/silicon dioxide-coated substrate, glass substrate, ITO substrate), pre-baked, exposed through a predetermined mask, subjected to PEB (post exposure bake), if necessary, developed, rinsed, and dried to obtain an excellent resist.

The present invention is explained in more detail with reference to the following examples, but the present invention should not be construed as being limited thereto. Unless otherwise indicated, all percents and parts are by weight.

EXAMPLES

Synthesis Example 1

Synthesis of Compound (I-1)

Into a four necked flask equipped with a stirrer, a reflux condenser, a thermometer and a dropping funnel, 1141.7 g of 2-cyclohexyl-5-methylphenol, 60.0 g of sodium hydroxide and 300 g of distilled water were charged, and the mixture was stirred. When the 2-cyclohexyl-5-methylphenol was dissolved, the mixed solution was heated to 50° C. A 37% aqueous solution of formalin was dropwise added to the aqueous solution over 3 hours, and the solution was heated with stirring for 6 hours. After the reaction was terminated, the reactant was cooled to room temperature, neutralized with concentrated hydrochloric acid, and the brown solid precipitated was filtrated. The solid obtained was thoroughly dissolved in a 25% aqueous solution of tetramethylammonium hydroxide, and neutralized with a 5% aqueous solution of ammonium hydrogencarbonate, thereby pale brown powder was precipitated. The powder was taken out by filtration. The powder was washed with distilled water, diluted aqueous hydrochloric acid, and distilled water in this order to obtain 409.2 g of Compound A.

Compound A

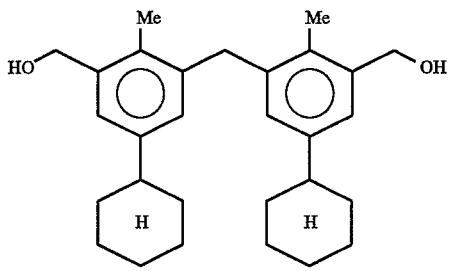

Compound C

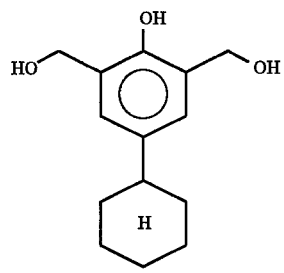

Into a similar reaction vessel, 227.3 g of the above obtained Compound A, 941.1 g of phenol and one liter of methanol were charged, and heated at 40° C. with stirring. When Compound A and the phenol were thoroughly dissolved, 5 g of concentrated sulfuric acid was dropwise added thereto over 10 minutes. The reaction system was stirred for 6 hours under reflux with heating. After the reaction was terminated, the mixed solution was crystallized in 10 liters of distilled water. The brown solid obtained was refined through a column chromatography to obtain 150.0 g of Compound (I-1).

Synthesis Example 2

Synthesis of Compound (I-5)

Compound B was synthesized in the same method as used in the synthesis of Compound A except for replacing 2-cyclohexyl-5-methylphenol with o-cresol as a raw material.

Into a similar reaction vessel, 144.2 g of the above obtained Compound B, 880 g of 2-cyclohexylphenol and one liter of methanol were charged and heated at 40° C. with stirring. When Compound B and the 2-cyclohexylphenol were thoroughly dissolved, 5 g of concentrated sulfuric acid was dropwise added thereto over 10 minutes. The reaction system was stirred for 8 hours under reflux with heating. After the reaction was terminated, the mixed solution was crystallized in 10 liters of distilled water. The brown solid obtained was refined through a column chromatography to obtain 180.0 g of Compound (I-5).

Compound B

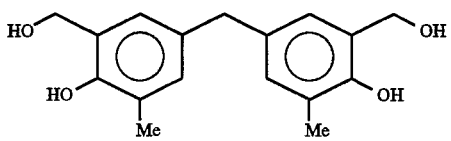

Synthesis Example 3

Synthesis of Compound (I-7)

Into a four necked flask equipped with a stirrer, a reflux condenser, a thermometer and a dropping funnel, 176.3 g of 4-cyclohexylphenol, 455.8 g of a 25% aqueous solution of tetramethylammonium hydroxide and 500 ml of distilled water were charged, and heated at 50° C. width stirring to dissolve the 4-cyclohexylphenol. To the mixed solution, 483.4 g of a 37% aqueous solution of formalin was dropwise added, and the solution was heated with stirring for 8 hours. The reaction mixture obtained was neutralized with hydrochloric acid, whereupon the white powder precipitated was taken out by filtration, to thereby obtain 160 g of Compound C.

Into a similar reaction vessel, 70.9 g of Compound C, 324.4 g of o-cresol and 600 ml of methanol were charged, and after Compound C was dissolved, 3.0 g of concentrated sulfuric acid was dropwise added thereto over 10 minutes. The mixed solution was stirred for 5 hours under reflux with heating. The reaction mixture obtained was poured into 6 liters of distilled water, whereupon the white solid formed was taken out by filtration and refined through a column chromatography to obtain 68.7 g of Compound D.

Compound D

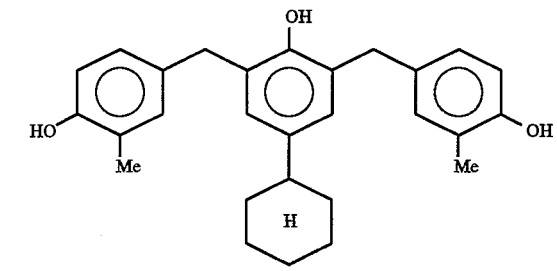

Into a similar reaction vessel, 41.7 g of the above obtained Compound D and 137.3 g of a 25% aqueous solution of tetramethylammonium hydroxide were charged, heated at 40° C. with stirring to dissolve Compound D. To the mixed solution, 48.7 g of a 37% aqueous solution of formalin was dropwise added, and the solution was heated with stirring for 8 hours. The reaction mixture obtained was neutralized with hydrochloric acid, whereupon the white powder precipitated was filtrated, to thereby obtain 42.9 g of Compound E.

Compound E

Into a similar reaction vessel, 42.9 g of the above obtained Compound E, 84.7 g of phenol and 150 ml of methanol were charged. After Compound E was dissolved, 1.0 g of concentrated sulfuric acid was dropwise added thereto over 10 minutes. The mixed solution was stirred for 5 hours under reflux with heating. The reaction mixture obtained was poured into 1.5 liters of distilled water, whereupon the white solid formed was taken out by filtration and refined through a column chromatography to obtain 37.7 g of white solid Compound (I-7).

Synthesis Example 4

Synthesis of Compound (I-9)

Into a four necked flask equipped with a stirrer, a reflux condenser, a thermometer and a dropping funnel, 168.2 g of bishydroxymethyl p-cresol synthesized in an ordinary method, 1.1 kg of o-cresol and 2 liters of methanol were charged, and heated at 40° C. with stirring. After the bishydroxymethyl p-cresol and the o-cresol were dissolved, 10 g of concentrated sulfuric acid was dropwise added thereto over 10 minutes. The reaction system was stirred for 4 hours under reflux with heating. After the reaction was terminated, the reaction mixture was crystallized in 20 liters of distilled water. The pale yellow solid obtained was taken out by filtration and refined by washing with toluene to obtain 278.8 g of Compound F.

Compound F

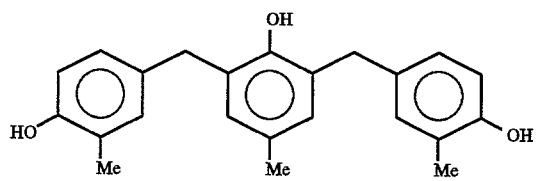

Into a similar reaction vessel, 278.8 g of Compound F and 1.1 kg of a 25% aqueous solution of tetramethylammonium hydroxide were charged, and heated at 40° C. with stirring to dissolve Compound F. To the mixed solution, 390 g of a 37% aqueous solution of formalin was dropwise added over one hour, and the solution was heated with stirring for 8 hours. The reaction mixture obtained was neutralized with hydrochloric acid, whereupon the white powder precipitated was filtrated, to thereby obtain 294.1 g of Compound G.

Compound G

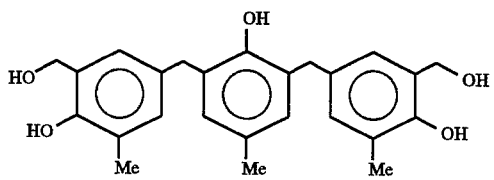

Into a similar reaction vessel, 204.3 g of the above obtained Compound G, 951.5 g of 2-cyclohexyl-5-methylphenol and one liter of methanol were charged. After Compound G and the 2-cyclohexyl-5-methylphenol were dissolved, 5.0 g of concentrated sulfuric acid was dropwise added thereto over 10 minutes. The mixed solution was stirred for 10 hours under reflux with heating. The reaction mixture obtained was poured into 10 liters of distilled water, whereupon the brown solid formed was taken out by filtration and refined through a column chromatography to obtain 225.9 g of white solid Compound (I-9).

Synthesis Example 5

Synthesis of Compound (I-11)

Into a four necked flask equipped with a stirrer, a reflux condenser, a thermometer and a dropping funnel, 118 g of the above obtained Compound C, 710 g of p-cresol and one liter of methanol were charged. After Compound C was dissolved, 5 g of concentrated sulfuric acid was dropwise added thereto over 10 minutes. The mixed solution was stirred for 5 hours under reflux with heating. The reaction mixture obtained was poured into 10 liters of distilled water, whereupon the white solid formed was taken out by filtration. Two liters of toluene was added to this white solid, stirred for 30 minutes, and insoluble matters were filtrated to obtain 80 g of Compound H.

Compound H

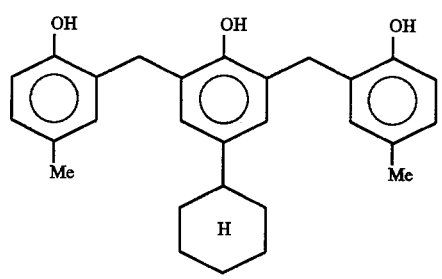

The above obtained Compound H (34.9 g) and potassium hydroxide (5.7 g) were dissolved in 300 ml of methanol/water (4/6) in a similar reaction vessel, and 81 g of a 37% aqueous solution of formalin was dropwise added thereto over one hour, and the mixture was reacted for 24 hours at 40° C. The reaction mixture was then diluted with 500 ml of distilled water and neutralized with hydrochloric acid. The crystals precipitated were filtrated and washed with water to thereby obtain 135 g of Compound I.

Compound I

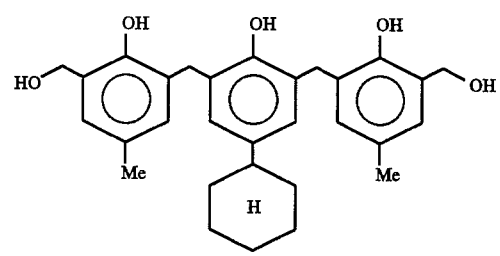

Phenol (56.5 g) and methanol (200 ml) were added to 20.5 g of Compound I, 3.0 g of a 36% aqueous solution of hydrochloric acid was further added thereto, and the mixed solution was heated under reflux for 7 hours. Subsequently, the reaction mixture was crystallized in 3 liters of water, and the solid precipitated was refined through a column chromatography to obtain 12 g of white powder Compound (I-11).

Synthesis Example 6

Synthesis of Compound (I-12)

p-Cresol trimer (323.0 g) prepared in an ordinary method and potassium hydroxide (57 g) were dissolved in 3 liters of methanol/water (4/6) in a four necked flask equipped with a stirrer, a reflux condenser, a thermometer and a dropping funnel, and 810 g of a 37% aqueous solution of formalin was dropwise added thereto over one hour, and the mixture was reacted for 24 hours at 40° C. The reaction mixture was then diluted with 5 liters of distilled water and neutralized with hydrochloric acid. The crystals precipitated were filtrated and washed with water to obtain 320 g of Compound J.

Compound J

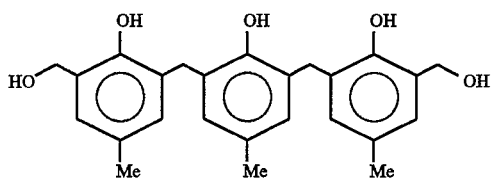

Into a similar reaction vessel, 183 g of Compound J, 793 g of 2-cyclohexylphenol and 2 liters of methanol were charged, and 28 g of a 36% aqueous solution of hydrochloric acid was further added thereto. The mixed solution was heated under reflux for 10 hours. Subsequently, the reaction mixture was crystallized in 20 liters of water, and the solid precipitated was refined through a column chromatography to obtain 135 g of white powder Compound (I-12).

Synthesis Example 7

Synthesis of Photosensitive Material (a)

Into a three necked flask, 60.1 g of Compound (I-1), 40.3 g of 1,2-naphthoquinonediazido-5-sulfonyl chloride and 800 ml of acetone were charged and dissolved uniformly. Next, 15.0 g of N-methylpiperidine was gradually and dropwise added thereto and the mixture was reacted for 3 hours at 25° C. The reaction mixture was then poured into 2.5 liters of a 1% aqueous solution of hydrochloric acid, whereupon the precipitate formed was taken out by filtration. The precipitate filtrated was washed with water and dried to thereby obtain 85.4 g of 1,2-naphthoquinonediazido-5-sulfonate of Compound (I-1) (Photosensitive Material (a)).

Synthesis Example 8

Synthesis of Photosensitive Material (b)

Into a three necked flask, 60.1 g of Compound (I-1), 53.7 g of 1,2-naphthoquinonediazido-5-sulfonyl chloride and 800 ml of acetone were charged and dissolved uniformly. Next, 20.8 g of N-methylpiperidine was gradually and dropwise added thereto and the mixture was reacted for 3 hours at 25° C. The reaction mixture was then poured into 2.5 liters of a 1% aqueous solution of hydrochloric acid, whereupon the precipitate formed was taken out by filtration. The precipitate filtrated was washed with water and dried to thereby obtain 95.9 g of 1,2-naphthoquinonediazido-5-sulfonate of Compound (I-1) (Photosensitive Material (b)).

Synthesis Example 9

Synthesis of Photosensitive Material (c)

Into a three necked flask, 60.1 g of Compound (I-1), 67.2 g of 1,2-naphthoquinonediazido-5-sulfonyl chloride and one liter of acetone were charged and dissolved uniformly. Next, 26.0 g of N-methylpiperidine was gradually and dropwise added thereto and the mixture was reacted for 3 hours at 25° C. The reaction mixture was then poured into 3.2 liters of a 1% aqueous solution of hydrochloric acid, whereupon the precipitate formed was taken out by filtration. The precipitate filtrated was washed with water and dried to thereby obtain 106.3 g of 1,2-naphthoquinonediazido-5-sulfonate of Compound (I-1) (Photosensitive Material (c)).

Synthesis Example 10

Synthesis of Photosensitive Material (d) (Comparative Example)

Into a three necked flask, 60.1 g of Compound (I-1), 94.0 g of 1,2-naphthoquinonediazido-5-sulfonyl chloride and 1.5 liters of acetone were charged and dissolved uniformly. Next, 37.2 g of triethylamine was gradually and dropwise added thereto and the mixture was reacted for 3 hours at 25° C. The reaction mixture was then poured into 4 liters of a 1% aqueous solution of hydrochloric acid, whereupon the precipitate formed was taken out by filtration. The precipitate filtrated was washed with water and dried to thereby obtain 126.4 g of 1,2-naphthoquinonediazido-5-sulfonate of Compound (I-1) (Photosensitive Material (d)).

Synthesis Example 11

Synthesis of Photosensitive Material (e)

Into a three necked flask, 60.1 g of Compound (I-5), 40.3 g of 1,2-naphthoquinonediazido-5-sulfonyl chloride and 800 ml of acetone were charged and dissolved uniformly. Next, 15.0 g of N-methylpiperidine was gradually and dropwise added thereto and the mixture was reacted for 3 hours at 25° C. The reaction mixture was then poured into 2.5 liters of a 1% aqueous solution of hydrochloric acid, whereupon the precipitate formed was taken out by filtration. The precipitate filtrated was washed with water and dried to thereby obtain 86.4 g of 1,2-naphthoquinonediazido-5-sulfonate of Compound (I-5) (Photosensitive Material (e)).

Synthesis Example 12

Synthesis of Photosensitive Material (f)

Into a three necked flask, 60.1 g of Compound (I-5), 53.7 g of 1,2-naphthoquinonediazido-5-sulfonyl chloride and 800 ml of acetone were charged and dissolved uniformly. Next, 20.8 g of N-methylpiperidine was gradually and dropwise added thereto and the mixture was reacted for 3 hours at 25° C. The reaction mixture was then poured into 2.5 liters of a 1% aqueous solution of hydrochloric acid, whereupon the precipitate formed was taken out by filtration. The precipitate filtrated was washed with water and dried to thereby obtain 97.0 g of 1,2-naphthoquinonediazido-5-sulfonate of Compound (I-5) (Photosensitive Material (f)).

Synthesis Example 13

Synthesis of Photosensitive Material (g)

Into a three necked flask, 62.9 g of Compound (I-7), 53.7 g of 1,2-naphthoquinonediazido-5-sulfonyl chloride and 900 ml of chloroform were charged and dissolved uniformly. Next, 20.8 g of N-methylpiperidine was gradually and dropwise added thereto and the mixture was reacted for 3 hours at 25° C. The reaction mixture was concentrated, then again dissolved in one liter of acetone, and poured into 3.2 liters of a 1% aqueous solution of hydrochloric acid, whereupon the precipitate formed was taken out by filtration. The precipitate filtrated was washed with water and dried to thereby obtain 98.4 g of 1,2-naphthoquinonediazido-5-sulfonate of Compound (I-7) (Photosensitive Material (g)).

Synthesis Example 14

Synthesis of Photosensitive Material (h)

Into a three necked flask, 62.9 g of Compound (I-7), 67.2 g of 1,2-naphthoquinonediazido-5-sulfonyl chloride and 900 ml of acetone were charged and dissolved uniformly. Next, 26.0 g of N-methylpiperidine was gradually and dropwise added thereto and the mixture was reacted for 3 hours at 25° C. The reaction mixture was then poured into 3 liters of a 1% aqueous solution of hydrochloric acid, whereupon the precipitate formed was taken out by filtration. The precipitate filtrated was washed with water and dried to thereby obtain 108.8 g of 1,2-naphthoquinonediazido-5-sulfonate of Compound (I-7) (Photosensitive Material (h)).

Synthesis Example 15

Synthesis of Photosensitive Material (i) (Comparative Example)

Into a three necked flask, 62.9 g of Compound (I-7), 107.5 g of 1,2-naphthoquinonediazido-5-sulfonyl chloride and 1.6 liters of acetone were charged and dissolved uniformly. Next, 42.5 g of triethylamine was gradually and dropwise added thereto and the mixture was reacted for 3 hours at 25° C. The reaction mixture was then poured into 5 liters of a 1% aqueous solution of hydrochloric acid, whereupon the precipitate formed was taken out by filtration. The precipitate filtrated was washed with water and dried to thereby obtain 140.2 g of 1,2-naphthoquinonediazido-5-sulfonate of Compound (I-7) (Photosensitive Material (i)).

Synthesis Example 16

Synthesis of Photosensitive Material (j)

Into a three necked flask, 75.3 g of Compound (I-9), 53.7 g of 1,2-naphthoquinonediazido-5-sulfonyl chloride and one liter of chloroform were charged and dissolved uniformly. Next, 20.8 g of N-methylpiperidine was gradually and dropwise added thereto and the mixture was reacted for 3 hours at 25° C. The reaction mixture was concentrated, then again dissolved in one liter of acetone, and poured into 3.2 liters of a 1% aqueous solution of hydrochloric acid, whereupon the precipitate formed was taken out by filtration. The precipitate filtrated was washed with water and dried to thereby obtain 112.6 g of 1,2-naphthoquinonediazido-5-sulfonate of Compound (I-9) (Photosensitive Material (j)).

Synthesis Example 17

Synthesis of Photosensitive Material (k)

Into a three necked flask, 62.9 g of Compound (I-11), 53.7 g of 1,2-naphthoquinonediazido-5-sulfonyl chloride and 900 ml of acetone were charged and dissolved uniformly. Next, 20.8 g of N-methylpiperidine was gradually and dropwise added thereto and the mixture was reacted for 3 hours at 25° C. The reaction mixture was then poured into 3 liters of a 1% aqueous solution of hydrochloric acid, whereupon the precipitate formed was taken out by filtration. The precipitate filtrated was washed with water and dried to thereby obtain 99.4 g of 1,2-naphthoquinonediazido-5-sulfonate of Compound (I-11) (Photosensitive Material (k)).

Synthesis Example 18

Synthesis of Photosensitive Material (l)

Into a three necked flask, 62.9 g of Compound (I-11), 67.2 g of 1,2-naphthoquinonediazido-5-sulfonyl chloride and 900 ml of acetone were charged and dissolved uniformly. Next, 26.0 g of N-methylpiperidine was gradually and dropwise added thereto and the mixture was reacted for 3 hours at 25° C. The reaction mixture was then poured into 3 liters of a 1% aqueous solution of hydrochloric acid, whereupon the precipitate formed was taken out by filtration. The precipitate filtrated was washed with water and dried to thereby obtain 110.0 g of 1,2-naphthoquinonediazido-5-sulfonate of Compound (I-11) (Photosensitive Material (l)).

Synthesis Example 19

Synthesis of Photosensitive Material (m)

Into a three necked flask, 75.3 g of Compound (I-12), 53.7 g of 1,2-naphthoquinonediazido-5-sulfonyl chloride and one liter of chloroform were charged and dissolved uniformly. Next, 20.8 g of N-methylpiperidine was gradually and dropwise added thereto and the mixture was reacted for 3 hours at 25° C. The reaction mixture was concentrated, then again dissolved in one liter of acetone, and poured into 3.2 liters of a 1% aqueous solution of hydrochloric acid, whereupon the precipitate formed was taken out by filtration. The precipitate filtrated was washed with water and dried to thereby obtain 113.6 g of 1,2-naphthoquinonediazido-5-sulfonate of Compound (I-12) (Photosensitive Material (m)).

Synthesis Example 20

Synthesis of Photosensitive Material (n) (Comparative Example)

Into a three necked flask, 46.9 g of the following Compound (II), 53.7 g of 1,2-naphthoquinonediazido-5-sulfonyl chloride and 800 ml of acetone were charged and dissolved uniformly. Next, 20.8 g of N-methylpiperidine was gradually and dropwise added thereto and the mixture was reacted for 3 hours at 25° C. The reaction mixture was then poured into 2.5 liters of a 1% aqueous solution of hydrochloric acid, whereupon the precipitate formed was taken out by filtration. The precipitate filtrated was washed with water and dried to thereby obtain 84.0 g of 1,2-naphthoquinonediazido-5-sulfonate of Compound (II) (Photosensitive Material (n)).

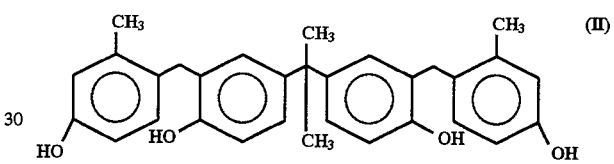

Synthesis Example 21

Synthesis of Photosensitive Material (o) (Comparative Example)

1,2-Naphthoquinonediazido-5-sulfonate of the following Compound (VII) (Photosensitive Material (o)) was prepared according to the method disclosed in JP-A-6-167805.

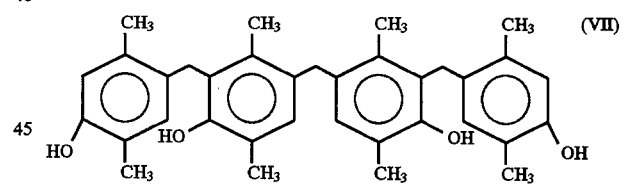

Synthesis Example 22

Synthesis of Photosensitive Material (p) (Comparative Example)

1,2-Naphthoquinonediazido-5-sulfonate of the following Compound (VIII) (Photosensitive Material (p)) was prepared according to the method disclosed in JP-A-6-167805.

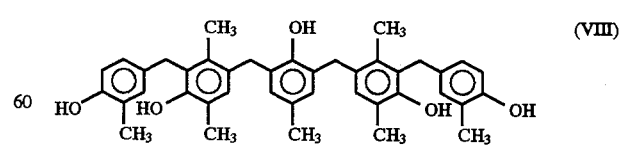

Synthesis Example 23

Synthesis of Photosensitive Material (q) (Comparative Example) 1,2-Naphthoquinonediazido-5-sulfonate of the following Compound (III) (Photosensitive Material (q)) was prepared according to the method disclosed in JP-A-3-291250.

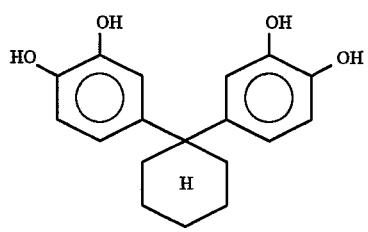

(III)

Synthesis Example 24

Synthesis of Photosensitive Material (r) (Comparative Example)

1,2-Naphthoquinonediazido-5-sulfonate of the following Compound (IV) (Photosensitive Material (r)) was prepared according to the method disclosed in JP-A-6-19130.

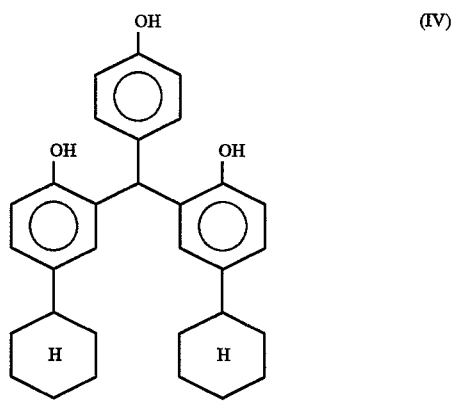

(IV)

Synthesis Example 25

Synthesis of Photosensitive Material (s) (Comparative Example)

1,2-Naphthoquinonediazido-5-sulfonate of the following Compound (V') (Photosensitive Material (s)) was prepared according to the method disclosed in JP-A-3-228057.

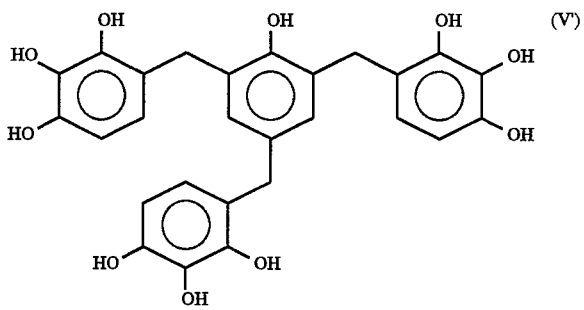

(V')

Synthesis Example 26

Synthesis of Photosensitive Material (t) (Comparative Example)

1,2-Naphthoquinonediazido-5-sulfonate of the following Compound (VI') (Photosensitive Material (t)) was prepared according to the method disclosed in JP-A-3-228057.

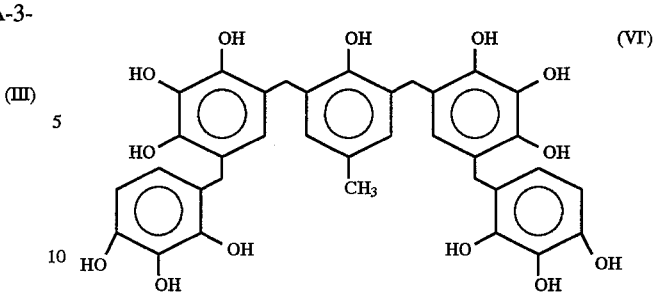

(VI')

Synthesis Example 27

Synthesis of Novolak Resin A

Into a three necked flask, 45 g of m-cresol, 55 g of p-cresol, 49 g of a 37% aqueous solution of formalin and 0.13 g of oxalic acid were charged, heated to 100° C. with stirring and allowed to react for 15 hours.

After then, the temperature of the reaction mixture was raised to 200° C., and the pressure in the flask was gradually reduced to 5 mm Hg, whereupon water, nonreacted monomers, formaldehyde and oxalic acid were removed. Subsequently, the melted alkali-soluble novolak resin was cooled to room temperature and recovered. Novolak Resin A thus obtained had a weight average molecular weight of 8,100 (in terms of polystyrene) and a degree of dispersion of 6.30.

Synthesis Example 28

Synthesis of Novolak Resin B

Into a three necked flask, 50 g of m-cresol, 25 g of p-cresol, 28 g of 2,5-xylenol, 53 g of a 37% aqueous solution of formalin and 0.15 g of oxalic acid were charged, heated to 100° C. with stirring and allowed to react for 14 hours.

After then, the temperature of the reaction mixture was raised to 200° C., and the pressure in the flask was gradually reduced to 1 mm Hg, whereupon water, nonreacted monomers, formaldehyde and oxalic acid were removed. Subsequently, the melted novolak resin was cooled to room temperature and recovered. The novolak resin thus obtained had a weight average molecular weight of 4,800 (in terms of polystyrene). Then, after 20 g of this novolak resin was thoroughly dissolved in 60 g of methanol, 30 g of water was gradually added thereto with stirring to precipitate the resin component. The upper layer was removed by decantation, the resin component precipitated was recovered and heated at 40° C., and dried under reduced pressure for 24 hours to thereby obtain alkali-soluble Novolak Resin B. Novolak Resin B thus obtained had a weight average molecular weight of 9,960 (in terms of polystyrene) and a degree of dispersion of 3.50. Further, the contents of monomers, dimers and trimers are 0%, 2.3%, 3.5%, respectively, and 43% of the low molecular weight components was excluded by fractional reprecipitation.

Synthesis Example 29

Synthesis of Novolak Resin C

Into a three necked flask, 60 g of m-cresol, 20 g of p-cresol, 25 g of 2,3,5-trimethylphenol, 56 g of a 37% aqueous solution of formalin and 0.16 g of oxalic acid were charged, heated to 100° C. with stirring and allowed to react for 16 hours.

After then, the temperature of the reaction mixture was raised to 200° C., and the pressure in the flask was gradually reduced to 1 mm Hg, whereupon water, nonreacted monomers, formaldehyde and oxalic acid were removed. Subsequently, the melted novolak resin was cooled to room temperature and recovered. The novolak resin thus obtained had a weight average molecular weight of 3,800 (in terms of polystyrene). Then, after 20 g of this novolak resin was thoroughly dissolved in 60 g of acetone, 60 g of hexane was gradually added thereto with stirring and the mixed solution was allowed to stand for 2 hours. The upper layer was removed by decantation, the resin composition precipitated was recovered and heated at 40° C., and dried under reduced pressure for 24 hours to thereby obtain alkali-soluble Novolak Resin C. Novolak Resin C thus obtained had a weight average molecular weight of 8,300 (in terms of polystyrene) and a degree of dispersion of 3.20. Further, the contents of monomers, dimers and trimers are 0%, 2.1%, 3.0%, respectively, and 56% of the low molecular weight components was excluded by fractional reprecipitation.

Synthesis Example 30

Synthesis of Novolak Resin D p-Cresol (30 g), o-cresol (14 g), 2,3-dimethylphenol (50 g), 2,3,5-trimethylphenol (20 g), and 2,6-dimethylphenol (4.9 g) were mixed with 50 g of diethylene glycol monomethyl ether, and charged into a three necked flask equipped with a stirrer, a reflux condenser and a thermometer. Subsequently, 85 g of a 37% aqueous solution of formalin was added thereto, and the mixed solution was heated at 110° C. in an oil bath with stirring. When the inner temperature of the flask reached 90° C., 6.3 g of oxalic acid dihydrate was added thereto. The reaction was continued for 18 hours while keeping the temperature of the oil bath at 130° C. Subsequently, the reflux condenser was removed from the flask, distillation was conducted under reduced pressure at 200° C. to remove the nonreacted monomers. The novolak resin thus obtained had an Mw of 3,280, and a degree of dispersion of 2.75.

Preparation and Evaluation of Positive Photoresist Compositions

Photosensitive materials (a) to (t) obtained in the above Synthesis Examples 7 to 26, Novolak Resins A to D obtained in the above Synthesis Examples 27 to 30, solvents, and polyhydroxy compounds, according to necessity, were mixed in proportions shown in Table 1 below to make uniform solutions, and then they were filtrated through a 0.10 μm microfilter made of Teflon to prepare photoresist compositions. The thus prepared photoresist compositions were coated onto a silicon wafer using a spinner with varying number of revolutions and dried on a vacuum contact type hot plate at 90° C. for 60 seconds to obtain resist layers having a thickness of 0.97 μm or 1.02 μm.

The layers were exposed using a reduction projection exposure device (reduction projection exposure device NSR-2005i9C, manufactured by Nikon Co.), then PEB was conducted at 110° C. for 60 seconds, developed with a 2.38% aqueous solution of tetramethylammonium hydroxide for 1 minute, washed with water for 30 seconds and dried.

The thus obtained resist pattern of the silicon wafer was observed with a scanning electron microscope to evaluate the properties of the resist. The results obtained are shown in Table 2 below.

The sensitivity was defined as the reciprocal of the exposure amount to reproduce a mask pattern of 0.60 μm, and expressed as a relative value to the sensitivity of the resist layer thickness of 1.02 μm in Comparative Example 1.

The resolving power is the critical resolving power in the exposure amount of reproducing a mask pattern of 0.60 μm.

The silicon wafer on which the resist pattern was formed was baked on a hot plate for 4 minutes, and the temperature at which the pattern did not deform was taken as the heat resistance.

The shape of the resist was represented by the angle (θ) formed by the wall surface of the resist and the plane surface of the silicon wafer in the cross section of a resist pattern of 0.60 μm.

The pattern-formed silicon wafer was observed with a scanning electron microscope to evaluate the development residue and expressed by "good" for those there was not observed residue and "bad" for those there observed residue.

The storage stability was evaluated in two ways, evaluation 1 and evaluation 2. As evaluation 1, the solution of the composition was stored at room temperature and the presence of the precipitate in the solution after 6 months was examined, and expressed by "good" for those there was not observed precipitate and "bad" for those there observed precipitate. As evaluation 2, the composition after being stored for 3 months in a clean room maintained at 35° C. was measured for number of fine grains of 0.30 μm or less (number/ml) with an automatic fine grain measuring instrument (KL-21 type) manufactured by Rion Co., Ltd.

TABLE 1

| | Novolak Resin | | Photosensitive Material | | Polyhydroxy Compound | | Solvent | |
|---|---|---|---|---|---|---|---|---|
| | Kind | Addition Amount (parts) | Kind | Addition Amount (parts) | Kind | Addition Amount (parts) | Kind | Addition Amount (parts) |
| Example 1 | A | 100 | a | 27 | — | — | s-1 | 350 |
| Example 2 | A | 100 | b | 28 | — | — | s-1 | 360 |
| Example 3 | A | 100 | c | 26 | — | — | s-1 | 370 |
| Example 4 | A | 100 | j | 26 | — | — | s-3 | 380 |
| Example 5 | B | 80 | b | 30 | p-1 | 20 | s-2/s-4 | 285/95 |
| Example 6 | B | 80 | e/k | 30 | p-2 | 18 | s-3 | 360 |
| Example 7 | B | 73 | f | 34 | p-2 | 27 | s-3 | 350 |
| Example 8 | B | 82 | g | 28 | p-3 | 20 | s-2 | 370 |
| Example 9 | B | 79 | h | 30 | p-3 | 20 | s-2 | 350 |
| Example 10 | C | 82 | b | 28 | p-3 | 21 | s-3 | 370 |
| Example 11 | C | 80 | k | 31 | p-2 | 18 | s-2/s-4 | 285/95 |
| Example 12 | C | 78 | i | 32 | p-2 | 21 | s-3 | 360 |
| Example 13 | C | 83 | m | 28 | p-1 | 20 | s-3 | 350 |
| Example 14 | D | 82 | b | 31 | p-1 | 21 | s-1 | 340 |
| Example 15 | D | 80 | f | 31· | p-1 | 22 | s-1 | 340 |

TABLE 1-continued

|  | Novolak Resin | | Photosensitive Material | | Polyhydroxy Compound | | Solvent | |
| --- | --- | --- | --- | --- | --- | --- | --- | --- |
|  | Kind | Addition Amount (parts) | Kind | Addition Amount (parts) | Kind | Addition Amount (parts) | Kind | Addition Amount (parts) |
| Example 16 | D | 85 | k | 26 | p-3 | 20 | s-2 | 360 |
| Comparative Example 1 | A | 100 | n | 25 | — | — | s-2 | 370 |
| Comparative Example 2 | A | 100 | o | 24 | — | — | s-2 | 380 |
| Comparative Example 3 | A | 100 | p | 25 | — | — | s-2 | 380 |
| Comparative Example 4 | A | 100 | q | 23 | — | — | s-2 | 350 |
| Comparative Example 5 | A | 100 | r | 22 | — | — | s-2 | 350 |
| Comparative Example 6 | A | 100 | s | 23 | — | — | s-2 | 360 |
| Comparative Example 7 | A | 100 | t | 24 | — | — | s-2 | 370 |
| Comparative Example 8 | B | 80 | d | 29 | p-2 | 20 | s-1 | 360 |
| Comparative Example 9 | B | 80 | i | 28 | p-3 | 18 | s-2 | 360 | p-1: α,α,α'-tris(4-hydroxyphenyl)-1-ethyl-4-isopropylbenzene
p-2: tris(4-hydroxyphenyl)methane
p-3: 1,1-bis(4-hydroxyphenyl)cyclohexane
s-1: ethyl cellosolve acetate
s-2: ethyl 2-hydroxypropionate
s-3: methyl 3-methoxypropionate
s-4: ethyl 3-ethoxypropionate

TABLE 2

|  | Relative Sensitivity | | Resolving Power (μm) | | | Shape of Resist (θ) | | | Storage Stability | |
| --- | --- | --- | --- | --- | --- | --- | --- | --- | --- | --- |
|  | Layer Thickness 0.97 μm | Layer Thickness 1.02 μm | Layer Thickness 0.97 μm | Layer Thickness 1.02 μm | Heat Resistance (°C.) | Layer Thickness 0.97 μm | Layer Thickness 1.02 μm | Development Residue | Evaluation 1 | Evaluation 2 |
| Example 1 | 1.1 | 1.2 | 0.32 | 0.32 | 150 | 88 | 88 | good | good | 52 |
| Example 2 | 1.1 | 1.1 | 0.30 | 0.30 | 150 | 89 | 89 | good | good | 48 |
| Example 3 | 1.2 | 1.3 | 0.32 | 0.32 | 150 | 89 | 89 | good | good | 55 |
| Example 4 | 1.1 | 1.2 | 0.32 | 0.32 | 150 | 89 | 89 | good | good | 58 |
| Example 5 | 1.1 | 1.1 | 0.30 | 0.30 | 160 | 89 | 89 | good | good | 57 |
| Example 6 | 1.0 | 1.1 | 0.32 | 0.32 | 160 | 88 | 88 | good | good | 46 |
| Example 7 | 1.1 | 1.2 | 0.30 | 0.30 | 160 | 88 | 88 | good | good | 57 |
| Example 8 | 1.0 | 1.1 | 0.32 | 0.32 | 160 | 89 | 89 | good | good | 55 |
| Example 9 | 1.2 | 1.2 | 0.32 | 0.32 | 160 | 89 | 89 | good | good | 53 |
| Example 10 | 1.0 | 1.1 | 0.30 | 0.30 | 160 | 88 | 88 | good | good | 45 |
| Example 11 | 1.1 | 1.2 | 0.32 | 0.32 | 160 | 89 | 89 | good | good | 48 |
| Example 12 | 1.1 | 1.2 | 0.32 | 0.32 | 160 | 88 | 88 | good | good | 53 |
| Example 13 | 1.0 | 1.1 | 0.32 | 0.32 | 160 | 89 | 89 | good | good | 52 |
| Example 14 | 1.1 | 1.2 | 0.28 | 0.28 | 160 | 89 | 89 | good | good | 47 |
| Example 15 | 1.1 | 1.2 | 0.28 | 0.28 | 160 | 89 | 89 | good | good | 42 |
| Example 16 | 1.0 | 1.1 | 0.30 | 0.30 | 160 | 89 | 89 | good | good | 46 |
| Comparative Example 1 | 0.9 | 1.0 | 0.34 | 0.36 | 140 | 87 | 88 | good | bad | 260 |
| Comparative Example 2 | 1.1 | 1.1 | 0.30 | 0.30 | 150 | 88 | 89 | good | good | 180 |
| Comparative Example 3 | 1.2 | 1.2 | 0.30 | 0.30 | 150 | 88 | 89 | good | good | 205 |
| Comparative Example 4 | 1.0 | 1.1 | 0.36 | 0.34 | 140 | 84 | 85 | bad | good | 70 |
| Comparative Example 5 | 0.8 | 1.0 | 0.34 | 0.32 | 140 | 83 | 82 | good | bad | 383 |
| Comparative Example 6 | 1.1 | 1.2 | 0.34 | 0.32 | 150 | 87 | 87 | good | good | 82 |
| Comparative Example 7 | 0.9 | 1.0 | 0.32 | 0.34 | 150 | 88 | 89 | good | good | 73 |

TABLE 2-continued

| | Relative Sensitivity | | Resolving Power (μm) | | | Shape of Resist (θ) | | | Storage | |
|---|---|---|---|---|---|---|---|---|---|---|
| | Layer | Layer | Layer | Layer | Heat | Layer | Layer | | Stability | |
| | Thickness 0.97 μm | Thickness 1.02 μm | Thickness 0.97 μm | Thickness 1.02 μm | Resistance (°C.) | Thickness 0.97 μm | Thickness 1.02 μm | Development Residue | Evaluation 1 | Evaluation 2 |
| Comparative Example 8 | 1.0 | 1.1 | 0.32 | 0.32 | 160 | 89 | 89 | good | good | 115 |
| Comparative Example 9 | 1.1 | 1.2 | 0.30 | 0.30 | 150 | 88 | 88 | good | good | 106 |

The results in Table 2 show that the resists using the photosensitive materials (a) to (m) of the present invention are excellent in resolving power and resist shape. Further, the resists containing the photosensitive materials of the present invention are also excellent in storage stability and exhibited good results in both evaluation 1 and evaluation 2. On the contrary, the resists containing comparative photosensitive materials were not sufficient for the storage stability because even if they were excellent in resolving power, shape of the resist and visual observation in evaluation 1 of the storage stability, many fine grains were generated in the evaluating method such as evaluation 2.

The present invention provides a positive photoresist composition which has a high resolving power and is less in the layer thickness reliance of the resolving power, has a broad development latitude and is less in generation of development residue, in which a photosensitizer does not precipitate with the lapse of time, microgel does not generate, that is, there is no increase of particles.

While the invention has been described in detail and with reference to specific examples thereof, it will be apparent to one skilled in the art that various changes and modifications can be made therein without departing from the spirit and scope thereof.

What is claimed is:

1. A positive photoresist composition comprising, in admixture, an alkali-soluble resin and [1,2-naphthoquinonediazido-5-(and/or-4-)sulfonate of a polyhydroxy compound represented by the following formula (I)] at least one of a 1,2-naphthoquinonediazido-5-sulfonate of polyhydroxy compound represented by the following formula (I) and a 1,2-naphthoquinonediazido-4-sulfonate of a polyhydroxy compound represented by the following formula (I):

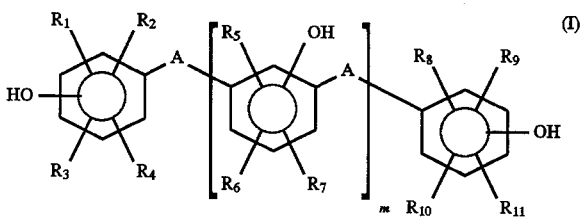

wherein $R_1$, $R_2$, $R_3$, $R_4$, $R_5$, $R_6$, $R_7$, $R_8$, $R_9$, $R_{10}$ and $R_{11}$ are the same or different and each represents a hydrogen atom, a halogen atom, an alkyl group, an aryl group, an alkoxyl group, an acyl group or a cycloalkyl group, provided that at least one of $R_1$ to $R_{11}$ is a cycloalkyl group;

A represents

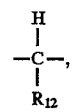

in which $R_{12}$ represents a hydrogen atom or an alkyl group; and
m represents 2 or 3.

2. The positive photoresist composition as claimed in claim 1, wherein the alkyl group represented by $R_1$ to $R_{12}$ is an alkyl group having from 1 to 4 carbon atoms.

3. The positive photoresist composition as claimed in claim 1, wherein the alkyl group represented by $R_1$ to $R_{12}$ is selected from the group consisting of a methyl group, an ethyl group, a propyl group, an isopropyl group, an n-butyl group, an isobutyl group, a sec-butyl group and a tert-butyl group.

4. The positive photoresist composition as claimed in claim 1, wherein the halogen atom represented by $R_1$ to $R_{11}$ is selected from the group consisting of a chlorine atom, a bromine atom and an iodine atom.

5. The positive photoresist composition as claimed in claim 1, wherein the aryl group represented by $R_1$ to $R_{11}$ is selected from the group consisting of a phenyl group, a toluyl group, a xylyl group, a mesityl group and a cumenyl group.

6. The positive photoresist composition as claimed in claim 1, wherein the alkoxy group represented by $R_1$ to $R_{11}$ is selected from the group consisting of a methoxy group, an ethoxy group, a propoxy group, an isopropoxy group, an n-butoxy group, an isobutoxy group, a sec-butoxy group and a tert-butoxy group.

7. The positive photoresist composition as claimed in claim 1, wherein the acyl group represented by $R_1$ to $R_{11}$ is selected from the group consisting of a formyl group, an acetyl group and a benzoyl group.

8. The positive photoresist composition as claimed in claim 1, wherein the cycloalkyl group represented by $R_1$ to $R_{11}$ is selected from the group consisting of a cyclopentyl group and a cyclohexyl group.

9. The positive photoresist composition as claimed in claim 1, wherein $R_1$ to $R_4$ and $R_8$ to $R_{11}$ are each selected from the group consisting of a methyl group, an ethyl group, a chlorine atom, a methoxy group, an acetyl group and a phenyl group; and $R_5$ to $R_7$ are each selected from the group consisting of a methyl group, an ethyl group, an isopropyl group, a phenyl group and a methoxy group, provided that at least one of $R_1$ to $R_{11}$ is a cycloalkyl group.

10. The positive photoresist composition as claimed in claim 1, wherein the compound represented by formula (I)

is selected from the group consisting of formula (I-1), (I-2), (I-3), (I-4), (I-5), (I-6), (I-7), (I-8), (I-9), (I-10), (I-11), and (I-12), wherein said formulae (I-1) to (I-12) are each represented as follows:
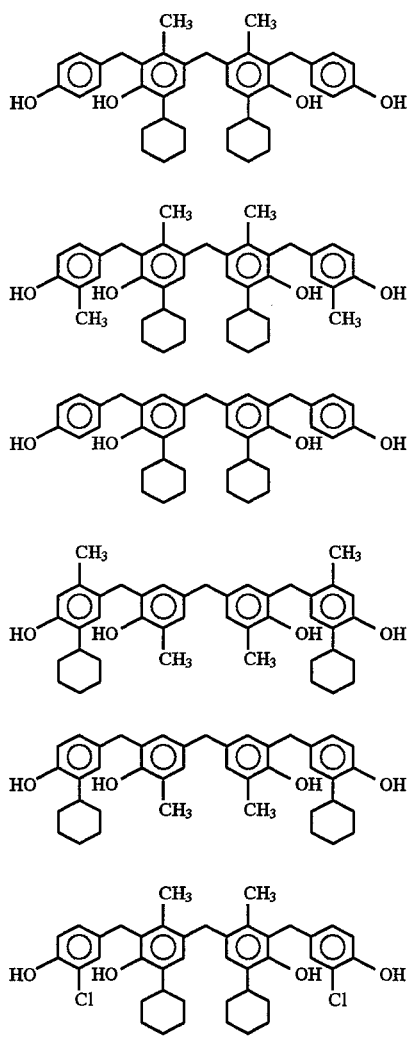
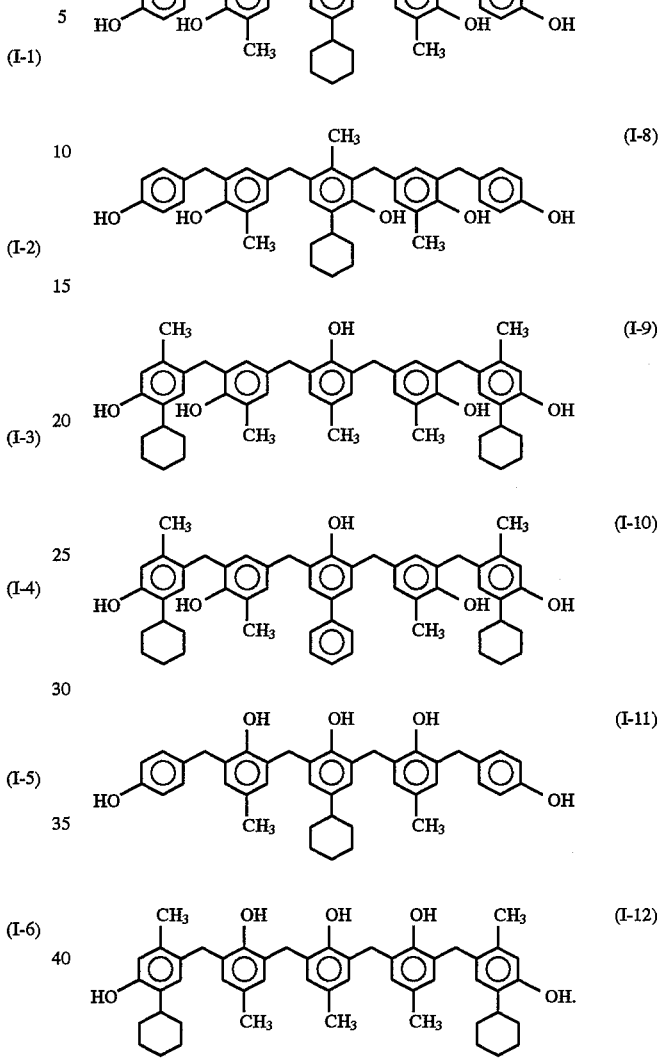
* * * * *